(12) United States Patent
Yin

(10) Patent No.: US 9,553,055 B2
(45) Date of Patent: Jan. 24, 2017

(54) METHOD FOR FABRICATING SEMICONDUCTOR DEVICES HAVING REINFORCING ELEMENTS

(71) Applicant: Asia Pacific Microsystems, Inc., Hsinchu (TW)

(72) Inventor: Hung-Lin Yin, Hsinchu (TW)

(73) Assignee: ASIA PACIFIC MICROSYSTEMS, INC., Hsinchu (TW)

( * ) Notice: Subject to any disclaimer, the term of this patent is extended or adjusted under 35 U.S.C. 154(b) by 0 days.

(21) Appl. No.: 14/922,334

(22) Filed: Oct. 26, 2015

(65) Prior Publication Data

US 2016/0240490 A1    Aug. 18, 2016

(30) Foreign Application Priority Data

Feb. 16, 2015  (TW) .............................. 104105400 A

(51) Int. Cl.
| | | |
|---|---|---|
| H01L 23/00 | (2006.01) | |
| H01L 21/283 | (2006.01) | |
| H01L 21/762 | (2006.01) | |
| B06B 1/02 | (2006.01) | |
| H01L 21/306 | (2006.01) | |

(52) U.S. Cl.
CPC .......... *H01L 23/562* (2013.01); *B06B 1/0292* (2013.01); *H01L 21/283* (2013.01); *H01L 21/76251* (2013.01); *H01L 24/84* (2013.01); *H01L 21/306* (2013.01); *H01L 21/762* (2013.01); *H01L 23/00* (2013.01)

(58) Field of Classification Search
CPC .. H01L 23/562; H01L 24/84; H01L 21/30604; H01L 21/283; H01L 21/76251; H01L 21/31111; H01L 21/31; H01L 21/306; H01L 21/311; H01L 21/762; H01L 23/00
See application file for complete search history.

(56) References Cited

U.S. PATENT DOCUMENTS

2005/0269698 A1* 12/2005 Okada ................... H01L 21/561
257/737

* cited by examiner

*Primary Examiner* — Thanh T Nguyen
(74) *Attorney, Agent, or Firm* — Chen-Chi Lin

(57) ABSTRACT

The present disclosure provides a method for fabricating semiconductor devices having reinforcing elements. The method includes steps of providing a first wafer having a lower electrode layer and an insulation layer; forming a device layer; etching the device layer and the insulation layer to form recesses; etching the device layer to form separation trenches and upper electrodes; forming reinforcing elements; and depositing metal pads. The reinforcing elements strengthen the integration of the upper electrodes and the insulation layer.

18 Claims, 7 Drawing Sheets

METHOD FOR FABRICATING SEMICONDUCTOR DEVICES HAVING REINFORCING ELEMENTS

PRIORITY TO A FOREIGN APPLICATION

The applicant claims priority to a foreign application, TW104105400.

FIELD OF THE INVENTION

This invention relates generally to a semiconductor manufacturing process. More particularly, the present invention relates to a method for fabricating semiconductor devices having reinforcing elements.

BACKGROUND OF THE INVENTION

A conventional capacitive sensor may include a lower electrode layer, an insulation layer, and upper electrodes. Interface areas between the insulation layer and the upper electrodes are usually very small. The very small interface areas lead to peeling of electrodes. It reduces the yield of the product. Separation trenches between upper electrodes are usually very narrow. Under high voltage operation, breaking down of the upper electrodes may occur. It reduces the reliability of the product.

SUMMARY OF THE INVENTION

The present disclosure provides a method for fabricating semiconductor devices having reinforcing elements. The method includes steps of providing a first wafer having a lower electrode layer and an insulation layer; forming a device layer; etching the device layer and the insulation layer to form recesses; etching the device layer to form separation trenches and upper electrodes; forming reinforcing elements; and depositing metal pads.

The present disclosure has numerous advantages over conventional techniques of fabricating semiconductor devices. The reinforcing elements strengthen the integration of the upper electrodes and the insulation layer. The reinforcing elements prevent etching fluids seeping into the semiconductor device. The reinforcing elements further isolate the upper electrodes. The method of the present disclosure may be applied to fabrication of capacitive sensors, capacitive micromachined ultrasonic transducers, pressure sensors, and microfluidic devices.

DETAILED DESCRIPTION OF THE INVENTION

Figure 1:
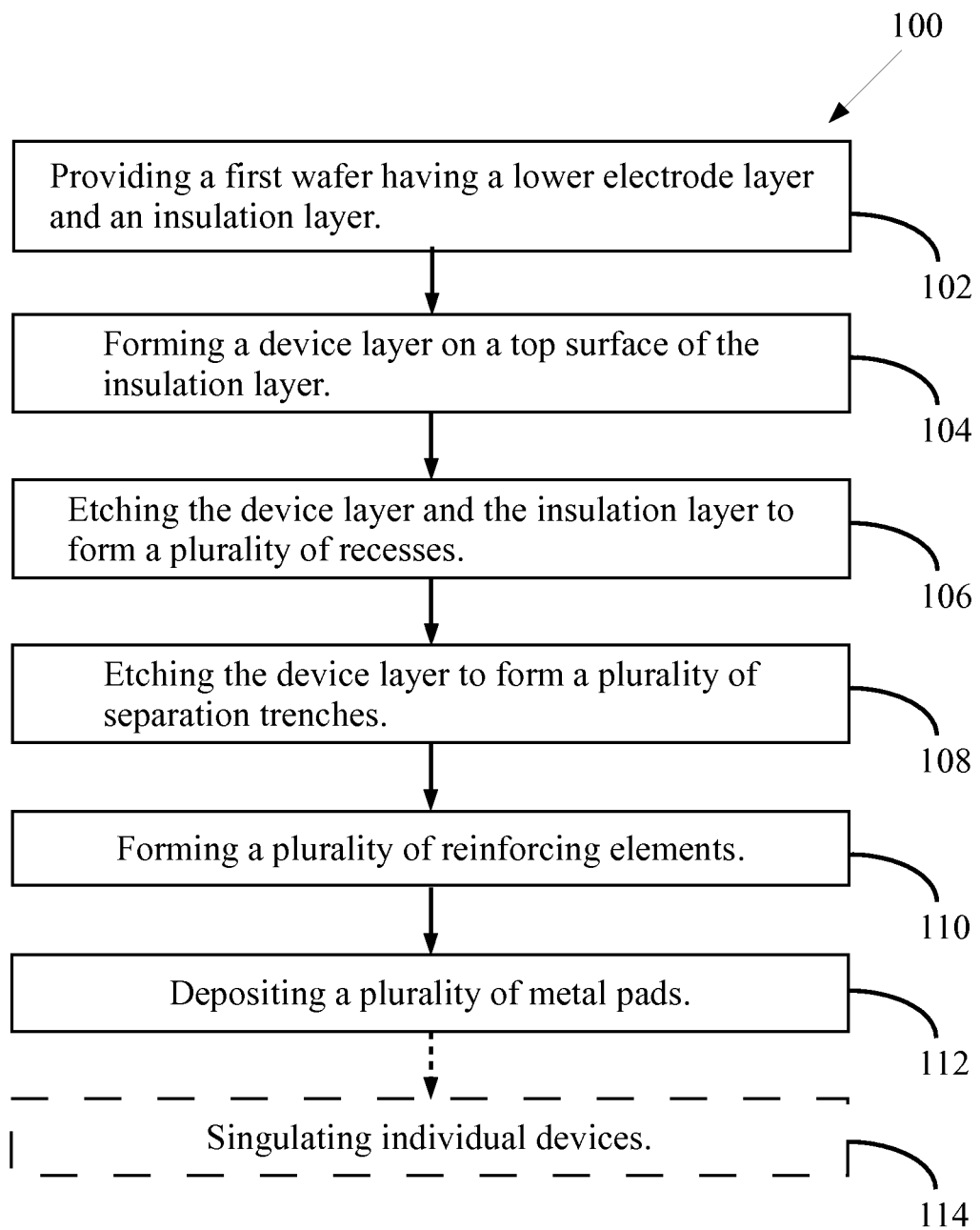
FIG. 1 is a flowchart of a method for fabricating semiconductor devices having reinforcing elements in examples of the present disclosure.

FIG. 1 is a flowchart of a method 100 for fabricating semiconductor devices having reinforcing elements in examples of the present disclosure. Method 100 may begin in block 102.

Figure 2A:
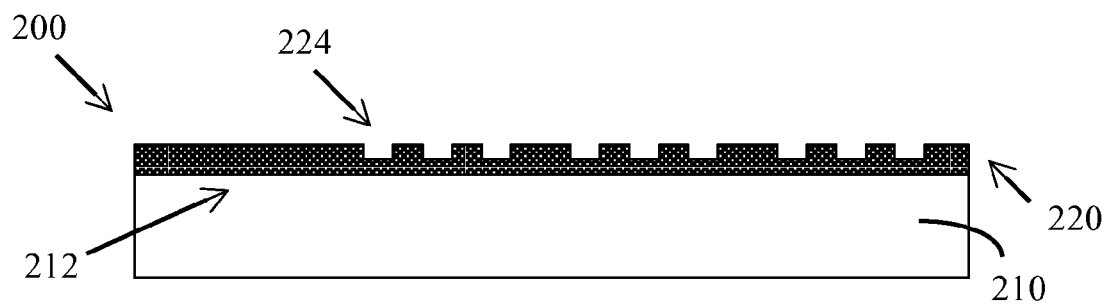
FIGS. 2A-2F are a series of cross-sectional views showing various processing steps for fabricating semiconductor devices having reinforcing elements in examples of the present disclosure.

In block 102, referring to FIG. 2A, a first wafer 200 is provided. The first wafer 200 has a lower electrode layer 210 and an insulation layer 220. The lower electrode layer 210 has a top surface 212. In examples of the present disclosure, the lower electrode layer 210 is made of silicon with a low resistivity, such as 0.01-1.0 Ω-cm. The insulation layer 220 is on top of the lower electrode layer 210. The insulation layer 220 has a plurality of grooves 224. Block 102 may be followed by block 104.

Figure 2B:
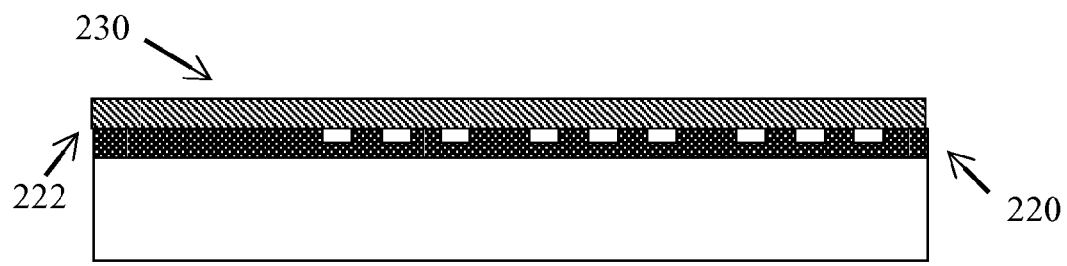

In block 104, referring to FIG. 2B, a device layer 230 is formed on a top surface 222 of the insulation layer 220. The plurality of grooves 224 are covered by the device layer 230. Block 104 may be followed by block 106.

Figure 4:
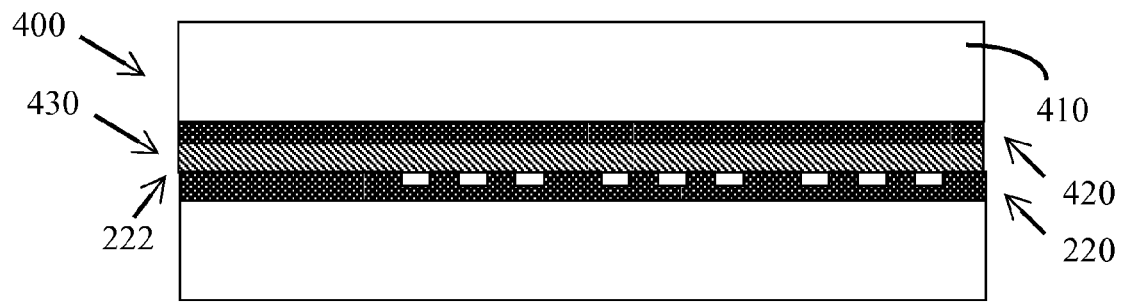
FIG. 4 is a cross-sectional view of semiconductor devices during another processing step in examples of the present disclosure.

In examples of the present disclosure, FIG. 4 shows a method to form the device layer 230 on the top surface 222 of the insulation layer 220. A second wafer 400 is bonded to the top surface 222 of the insulation layer 220. The second wafer 400 may be a silicon-on-insulation (SOI) wafer having a handle layer 410, a middle oxide layer 420, and a silicon layer 430. The advantage of using an SOI wafer is to precisely control the device layer thickness. The handle layer 410 and the middle oxide layer 420 are then removed. The device layer 230 (FIG. 2B) is formed by the silicon layer 430 of the second wafer 400. In examples of the present disclosure, when the thickness of the device layer 230 is not critical to the performance. A blank silicon wafer can be used as the second wafer 400. The device layer 230 can be formed by partially etching or grinding the second wafer 400 to a predetermined thickness.

Figure 2C:
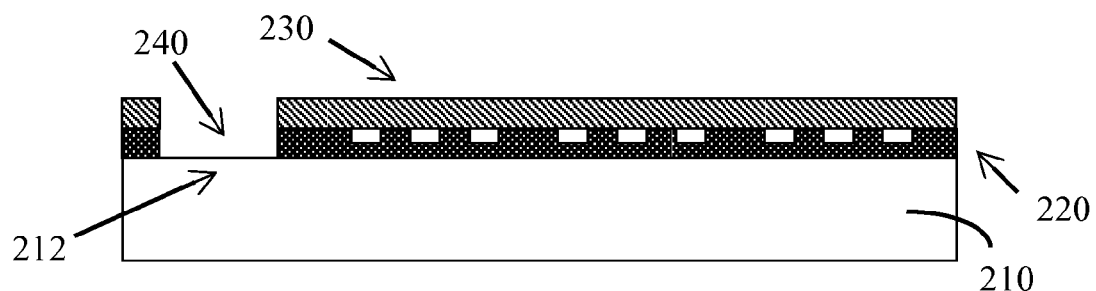

In block 106, referring to FIG. 2C, the device layer 230 and the insulation layer 220 are etched to form a plurality of recesses 240. A plurality of sections of a top surface 212 of the lower electrode layer 210 are exposed. Block 106 may be followed by block 108.

Figure 2D:
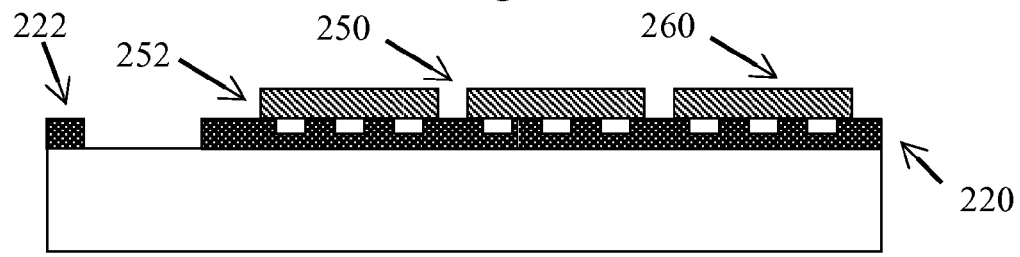

In block 108, referring to FIG. 2D, the device layer 230 of FIG. 2C is etched to form a plurality of separation trenches 250. Each of the plurality of separation trenches 250 has sidewalls 252. A plurality of sections of the top surface 222 of the insulation layer 220 are exposed. The plurality of separation trenches 250 separate the device layer 230 of FIG. 2C into a plurality of upper electrodes 260. In examples of the present disclosure, the plurality of upper electrodes 260 are made of silicon with a low resistivity. Block 108 may be followed by block 110.

Figure 2E:
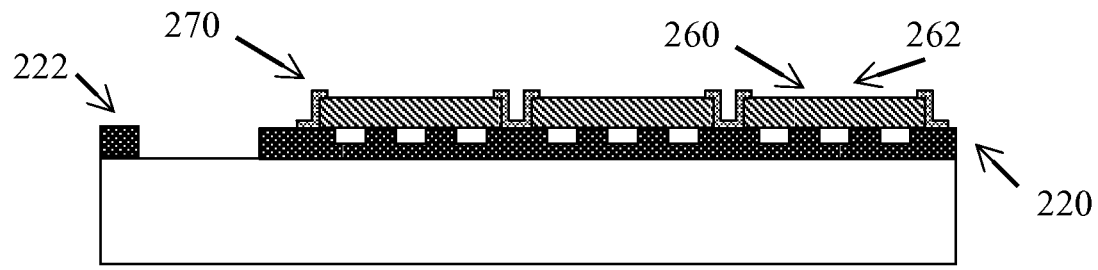

In block 110, referring to FIG. 2E, a plurality of reinforcing elements 270 are formed. The plurality of reinforcing elements 270 cover at least portions of sidewalls 252 (FIG. 2D) of the plurality of separation trenches 250 (FIG. 2D), at least portions of the plurality of exposed sections of the top surface 222 of the insulation layer 220, and at least portions of top surfaces 262 of the plurality of upper electrodes 260. In one example, the plurality of reinforcing elements 270 in a cross sectional view is of a letter U shape. In another example, the plurality of reinforcing elements 270 in a cross sectional view is of a letter S shape. In examples of the present disclosure, the plurality of reinforcing elements 270 are made of dielectric materials to isolate the plurality of upper electrodes 260. In one example, the plurality of reinforcing elements 270 are made of silicon oxide. In another example, the plurality of reinforcing elements 270 are made of silicon nitride. In still another example, the plurality of reinforcing elements 270 are made of benzocyclobutene (BCB). In still another example, the plurality of reinforcing elements 270 are made of polyimide. In yet another example, the plurality of reinforcing elements 270 are made of photoresist. In examples of the present disclosure, the plurality of separation trenches 250 (FIG. 2D) are offset from the plurality of grooves 224 (FIG. 2A) of the insulation layer 220. In examples of the present disclosure, the device is an actuator or a capacitive sensing element. The plurality of upper electrodes 260 move against the plurality of grooves 224 while under pressure or force. Block 110 may be followed by block 112.

Figure 5:
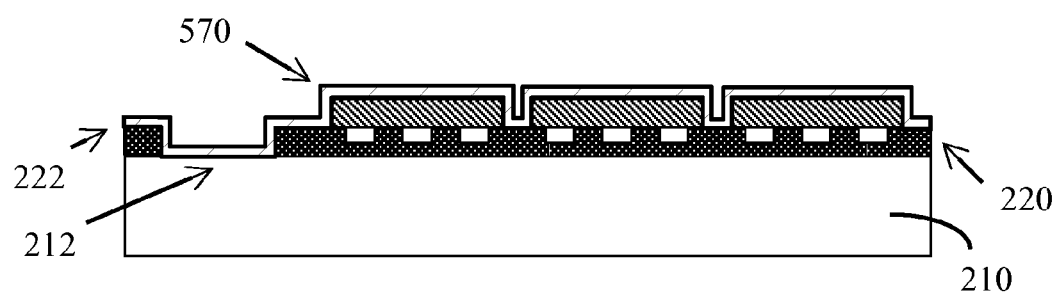
FIG. 5 is a cross-sectional view of semiconductor devices during still another processing step in examples of the present disclosure.

In examples of the present disclosure, FIG. 5 shows a method to form plurality of reinforcing elements 270. A reinforcing layer 570 is deposited on the sidewalls 252 (FIG. 2D) of the plurality of separation trenches 250 (FIG. 2D), on the plurality of exposed sections of the top surface 222 of the insulation layer 220, and on the top surfaces 262 (FIG. 2E) of the plurality of upper electrodes 260 (FIG. 2E). In one example, the reinforcing layer 570 also covers the plurality of exposed sections of the top surface 212 of the lower electrode layer 210. The reinforcing layer 570 is then patterned and etched to form the plurality of reinforcing elements 270 (FIG. 2E).

Figure 3:
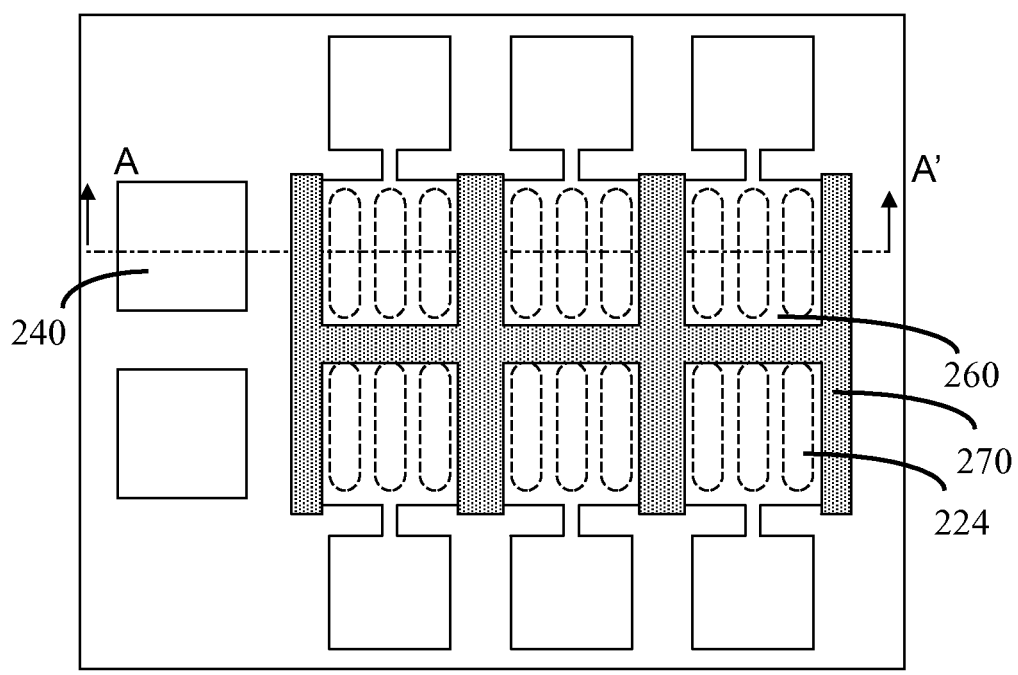
FIG. 3 is a top view of semiconductor devices having reinforcing elements during a processing step in examples of the present disclosure.

FIG. 3 is a top view of semiconductor devices having reinforcing elements during a processing step in examples of the present disclosure. FIG. 2E is a cross-sectional view, cutting by a plane AA' of FIG. 3. In FIG. 3, the plurality of grooves 224 are shown in dashed lines. The plurality of reinforcing elements 270 are on the portions of top surfaces 262 (FIG. 2E) of the plurality of upper electrodes 260. In examples of the present disclosure, the plurality of recesses 240 are of rectangular shapes.

Figure 2F:
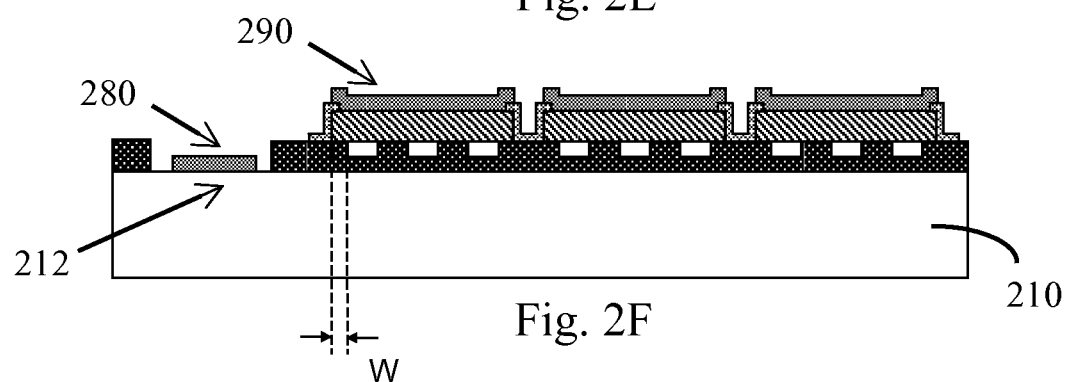

In block 112, referring to FIG. 2F, a plurality of metal pads 280 are deposited on the plurality of exposed sections of the top surface 212 of the lower electrode layer 210. A plurality of metal pads 290 are deposited on the top surfaces 262 (FIG. 2E) of the plurality of upper electrodes 260 (FIG. 2E). In one example, the plurality of deposited metal pads 290 are on portions of the plurality of reinforcing elements 270 (FIG. 2E) covering the portions of top surfaces 262 (FIG. 2E) of the plurality of upper electrodes 260 (FIG. 2E). In examples of the present disclosure, the distance, the width W, between one end of a selected separation trench of the plurality of separation trenches 250 (FIG. 2D) and one end of a selected groove of the plurality of grooves 224 (FIG. 2A) of the insulation layer 220 (FIG. 2A) is less than ten microns. The metal pads 290 may induce high residual stresses during deposition. The reinforcing elements 270 may prevent the plurality of upper electrodes 260 from being peeling off from the top surface 222 of the insulation layer 220. Block 112 may be followed by optional block 114.

In optional block 114, the first wafer 200 (FIG. 2A) is singulated to form individual devices. In examples of the present disclosure, the devices are capacitive micromachined ultrasonic transducers.

Figure 6:
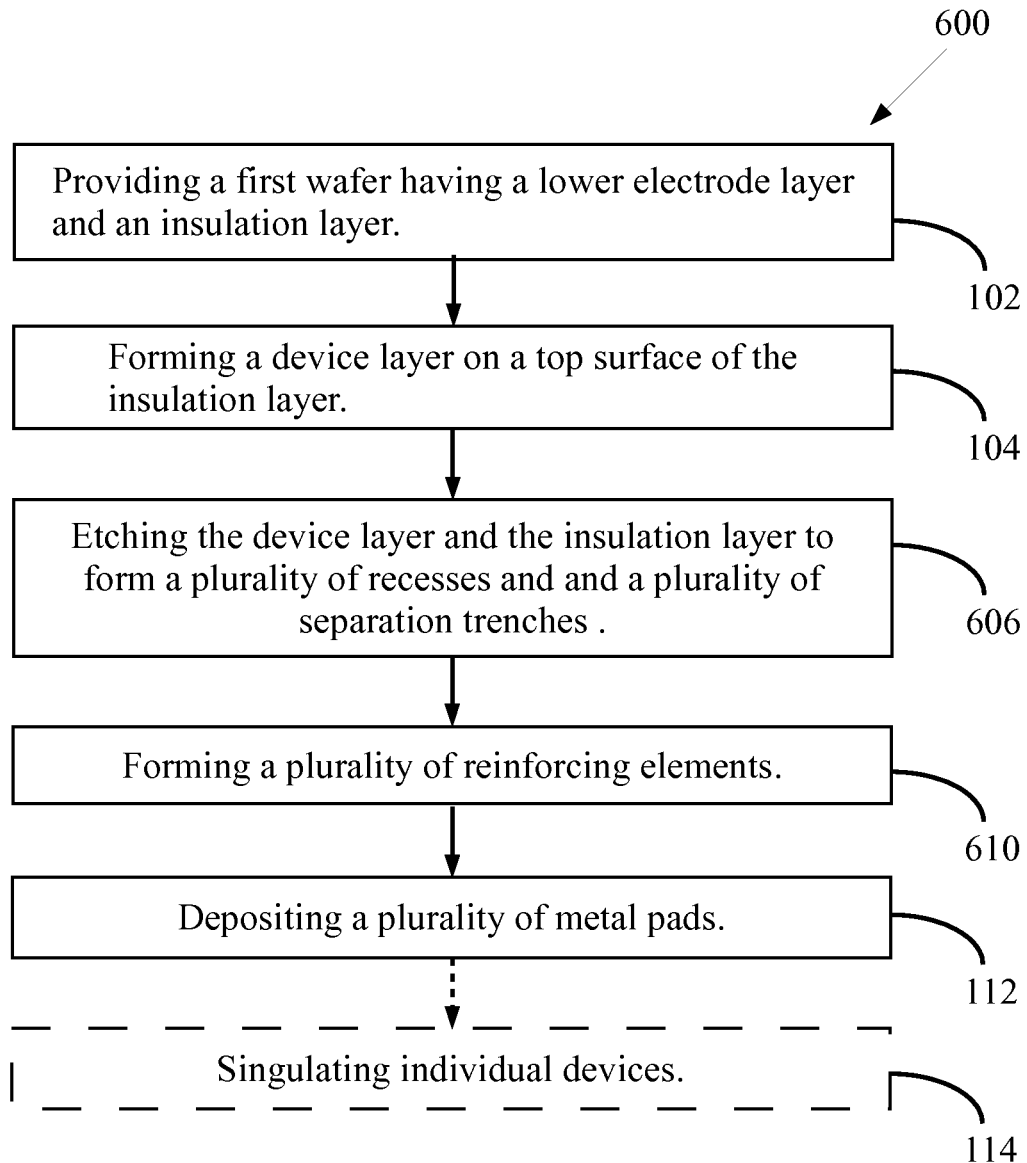
FIG. 6 is a flowchart of another method for fabricating semiconductor devices having reinforcing elements in examples of the present disclosure.

FIG. 6 is a flowchart of another method 600 for fabricating semiconductor devices having reinforcing elements in examples of the present disclosure. Method 600 is a variation of method 100 of FIG. 1. Blocks 106 and 108 of FIG. 1 are replaced by block 606 of FIG. 6. Block 110 of FIG. 1 is replaced by block 610 of FIG. 6. Block 104 may be followed by block 606.

Figure 7A:
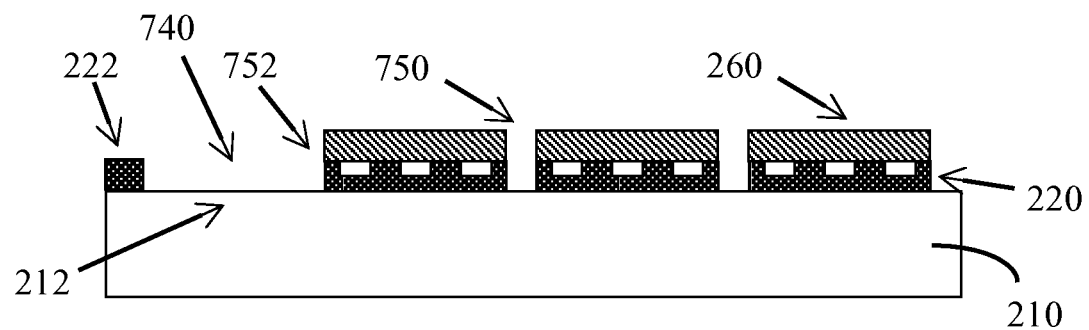
FIG. 7A and FIG. 7B are a series of cross-sectional views showing variations of processing steps for fabricating semiconductor devices having reinforcing elements in examples of the present disclosure.

In block 606, referring to FIG. 7A, the device layer 230 (FIG. 2B) and the insulation layer 220 are etched to form a plurality of recesses 740 and a plurality of separation trenches 750. Each of the plurality of separation trenches 750 has sidewalls 752. A first and second pluralities of sections of a top surface 212 of the lower electrode layer 210 are exposed. The plurality of separation trenches 750 separate the device layer 230 of FIG. 2B into a plurality of upper electrodes 260. In examples of the present disclosure, the plurality of upper electrodes 260 are made of silicon. Block 606 may be followed by block 610.

Figure 7B:
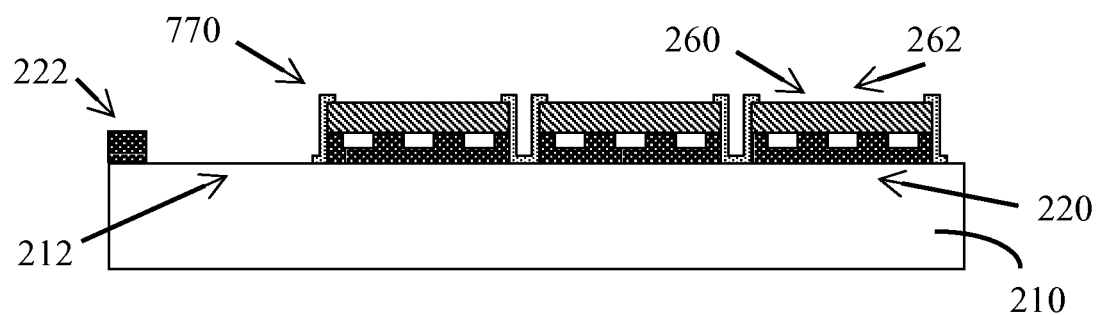

In block 610, referring to FIG. 7B, a plurality of reinforcing elements 770 are formed. The plurality of reinforcing elements 770 cover at least portions of sidewalls 752 (FIG. 7A) of the plurality of separation trenches 750 (FIG. 7A), at least portions of the second plurality of exposed sections of the top surface 212 of the lower electrode layer 210, and at least portions of top surfaces 262 of the plurality of upper electrodes 260. In one example, the plurality of reinforcing elements 770 in a cross sectional view is of a letter U shape. In another example, the plurality of reinforcing elements 770 in a cross sectional view is of a letter S shape. In examples of the present disclosure, the plurality of reinforcing elements 770 are selected from the group consisting of silicon oxide, silicon nitride, benzocyclobutene (BCB), and photoresist. In yet another example, the plurality of reinforcing elements 770 are made of photoresist. In examples of the present disclosure, the plurality of separation trenches 750 (FIG. 7A) are offset from the plurality of grooves 224 (FIG. 2A) of the insulation layer 220. Block 610 may be followed by block 112.

Figure 8A:
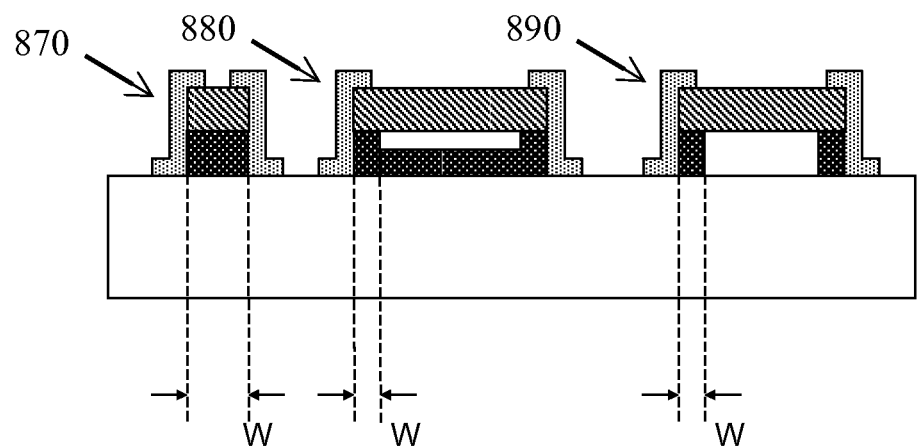
FIG. 8A is a cross-sectional view and FIG. 8B is a top view showing variations of reinforcing elements in examples of the present disclosure.
Figure 8B:
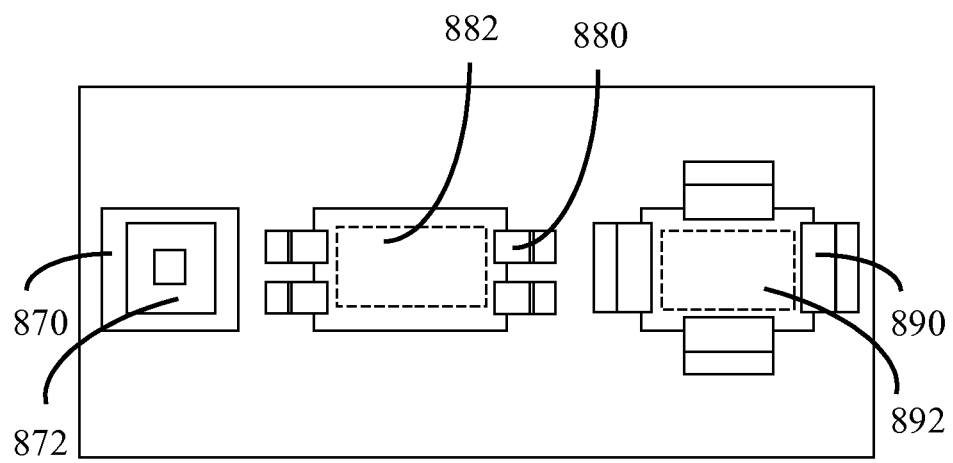

FIG. 8A is a cross-sectional view and FIG. 8B is a top view showing variations of reinforcing elements in examples of the present disclosure. The critical width W may be the smallest width dimension in the cross section of the device. A reinforcing element 870 surrounds a device 872. A plurality of reinforcing elements 880 are distributed at two opposite sides of a device 882. One or more reinforcing elements of the plurality of reinforcing elements 880 may be distributed at one side of the device 882. A plurality of reinforcing elements 890 are distributed at four sides of a device 892.

Those of ordinary skill in the art may recognize that modifications of the embodiments disclosed herein are possible. For example, the number of reinforcing elements applied to a device may vary. Other modifications may occur to those of ordinary skill in this art, and all such modifications are deemed to fall within the purview of the present invention, as defined by the claims.

The invention claimed is:
1. A method for fabricating semiconductor devices, the method comprising the steps of:
   providing a wafer;
   forming a device layer on a top surface of the wafer;
   etching the device layer to form a plurality of separation trenches so as to expose a plurality of sections of the wafer, the plurality of separation trenches separating the device layer into a plurality of structure members; and forming one or more reinforcing elements connecting one or more structure members of the plurality of structure members to the wafer so as to strengthen an integration of the plurality of structure members and the wafer; wherein the one or more reinforcing elements are made of a dielectric material;

wherein the wafer has a substrate and an insulation layer on top of the substrate;

wherein the device layer is attached to the insulation layer;

wherein the substrate and the plurality of structure members form a plurality of electrode units;

wherein the plurality of structure members are a plurality of upper electrodes;

wherein the substrate is a lower electrode layer; and wherein the substrate and the plurality of structure members are made of a low resistance silicon.

2. The method of claim 1, wherein the insulation layer has a plurality of grooves, wherein the device layer covers the plurality of grooves, and wherein the plurality of separation trenches are offset from the plurality of grooves.

3. The method of claim 1, wherein the one or more reinforcing elements cover at least portions of sidewalls of the plurality of separation trenches, at least portions of the plurality of exposed sections of the wafer, and at least portions of top surfaces of the plurality of structure members.

4. The method of claim 1, wherein the step of etching the device layer to form a plurality of separation trenches comprises the sub-step of etching the device layer and the insulation layer so as to expose a plurality of sections of the substrate.

5. The method of claim 1, further comprising:
after the step of forming one or more reinforcing elements, forming a structure layer on top of the device layer; wherein the structure layer is made of metal.

6. The method of claim 1, wherein at least one of the plurality of structure members has a critical width less than ten microns.

7. The method of claim 1, wherein the wafer has a substrate and an insulation layer on top of the substrate;
wherein the device layer is attached to the insulation layer;
wherein the step of etching the device layer to form a plurality of separation trenches comprises the sub-steps of
etching the device layer so as to expose a plurality of sections of the insulation layer; and
etching the insulation layer so as to expose a plurality of sections of the substrate.

8. A method for fabricating semiconductor devices, the method comprising the steps of:
providing a first wafer having a lower electrode layer and an insulation layer on top of the lower electrode layer, the insulation layer having a plurality of grooves;
forming a device layer on a top surface of the insulation layer;
etching the device layer and the insulation layer to form a plurality of recesses so as to expose a plurality of sections of a top surface of the lower electrode layer of the first wafer;
etching the device layer to form a plurality of separation trenches so as to expose a plurality of sections of the top surface of the insulation layer, the plurality of separation trenches separating the device layer into a plurality of upper electrodes;
forming a plurality of reinforcing elements covering at least portions of sidewalls of the plurality of separation trenches, at least portions of the plurality of exposed sections of the top surface of the insulation layer, and at least portions of top surfaces of the plurality of upper electrodes; and
forming a first plurality of metal pads on the plurality of exposed sections of the top surface of the lower electrode layer of the first wafer and forming a second plurality of metal pads on the top surfaces of the plurality of upper electrodes.

9. The method of claim 8, wherein the plurality of upper electrodes and the lower electrode layer are made of silicon.

10. The method of claim 8, wherein the plurality of reinforcing elements are made of dielectric materials.

11. The method of claim 10, wherein the dielectric materials are selected from the group consisting of silicon oxide, silicon nitride, benzocyclobutene (BCB), polyimide, and photoresist.

12. The method of claim 8, wherein the step of forming a device layer comprises the sub-steps of:
bonding a second wafer to the top surface of the insulation layer of the first wafer, the second wafer being a silicon-on-insulation wafer and having a handle layer, a middle oxide layer, and a silicon layer; and
removing the handle layer and the middle oxide layer of the second wafer, wherein the silicon layer of the second wafer is the device layer.

13. The method of claim 8, wherein the second plurality of deposited metal pads are on portions of the plurality of reinforcing elements covering the portions of top surfaces of the plurality of upper electrodes.

14. The method of claim 8, wherein a distance between one end of a selected separation trench of the plurality of separation trenches and one end of a selected groove of the plurality of grooves of the insulation layer is less than ten microns.

15. The method of claim 8, wherein the plurality of separation trenches are offset from the plurality of grooves of the insulation layer.

16. The method of claim 8, wherein each of the plurality of reinforcing elements in a cross sectional view is of a letter S shape.

17. The method of claim 8, wherein each of the plurality of reinforcing elements in a cross sectional view is of a letter U shape.

18. A method for fabricating semiconductor devices, the method comprising the steps of:
providing a first wafer having a lower electrode layer and an insulation layer on top of the lower electrode layer, the insulation layer having a plurality of grooves;
forming a device layer on a top surface of the insulation layer;
forming a plurality of recesses from the device layer and the insulation layer so as to expose a plurality of sections of a top surface of the lower electrode layer of the first wafer;
forming a plurality of separation trenches from the device layer so as to expose a plurality of sections of the top surface of the insulation layer, the plurality of separation trenches separating the device layer into a plurality of upper electrodes;
forming a plurality of reinforcing elements covering at least portions of sidewalls of the plurality of separation trenches, at least portions of the plurality of exposed sections of the top surface of the insulation layer, and at least portions of top surfaces of the plurality of upper electrodes; and forming a first plurality of metal pads on the plurality of exposed sections of the top surface of the lower electrode layer of the first wafer and forming a second plurality of metal pads on the top surfaces of the plurality of upper electrodes.

* * * * *